(12) United States Patent
Lee

(10) Patent No.: US 9,721,997 B2
(45) Date of Patent: Aug. 1, 2017

(54) ORGANIC LIGHT EMITTING DEVICE

(71) Applicant: LG DISPLAY CO., LTD., Seoul (KR)

(72) Inventor: SeHee Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/713,879

(22) Filed: May 15, 2015

(65) Prior Publication Data
US 2015/0333296 A1    Nov. 19, 2015

(30) Foreign Application Priority Data

May 16, 2014    (KR) .................. 10-2014-0059208

(51) Int. Cl.
*H01L 27/32*    (2006.01)
*H01L 51/52*    (2006.01)
*H01L 51/50*    (2006.01)

(52) U.S. Cl.
CPC ...... *H01L 27/3211* (2013.01); *H01L 27/3209* (2013.01); *H01L 27/3216* (2013.01); *H01L 51/504* (2013.01); *H01L 51/5064* (2013.01); *H01L 51/5278* (2013.01); *H01L 2251/558* (2013.01)

(58) Field of Classification Search
CPC ............ H01L 27/3211; H01L 2227/32; H01L 27/3216; H01L 51/5278; H01L 27/3209; H01L 51/5064; H01L 51/504; H01L 2251/558
See application file for complete search history.

(56) References Cited

U.S. PATENT DOCUMENTS

2012/0205686 A1*    8/2012    Seo .................. H01L 27/3209
257/89

* cited by examiner

*Primary Examiner* — Michael Jung
*Assistant Examiner* — Mikka Liu
(74) *Attorney, Agent, or Firm* — Birch, Stewart, Kolasch & Birch, LLP

(57) ABSTRACT

Provided is an organic light emitting device including: an organic emission layer disposed between a first electrode and a second electrode and in a plurality of sub-pixel areas; a plurality of electroluminescence units which include the organic emission layer and are formed by stacking; and a charge generation layer between the plurality of electroluminescence units, where the charge generation layers respectively disposed in the plurality of sub-pixel areas have a step and are formed at different positions, and the second electrodes respectively disposed in the multiple sub-pixel areas have a step and are formed at different positions.

22 Claims, 7 Drawing Sheets

ORGANIC LIGHT EMITTING DEVICE

CROSS-REFERENCE TO RELATED APPLICATIONS

This application claims the priority of Korean Patent Application No. 2014-0059208 filed on May 16, 2014, in the Korean Intellectual Property Office, the disclosure of which is incorporated herein by reference.

BACKGROUND OF THE INVENTION

Field of the Invention

The present invention relates to an organic light emitting device, and more particularly, to an organic light emitting device capable of improving optical reliability by improving a light leakage phenomenon in an organic light emitting display device.

Description of the Related Art

An organic light emitting display device (OLED) is a self-light emitting display device that uses an organic light emitting device. This organic light emitting device emits light when electrons and holes are injected into an emission layer from a cathode used for injecting electrons and an anode used for injecting holes. As excitons are formed from the combination of the injected electron and hole transitions, it produces an organic light emitting device when it moves from an excited state to a ground state.

The OLED can be classified into a top emission type, a bottom emission type, and a dual emission type depending on a direction of light emission, and can also be classified into a passive matrix type and an active matrix type depending on a driving method.

The OLED is a self-light emitting display device that does not need a separate light source such as a backlight for a liquid crystal display (LCD), and, thus, the OLED can be manufactured into a lightweight and thin form. Further, the OLED is advantageous in terms of power consumption since it is driven with a low voltage. Also, the OLED has an excellent color expression ability, a high response speed, a wide viewing angle, and a high contrast ratio (CR). Therefore, the OLED has received attention as a next-generation display device.

With the development of high-resolution display devices, the number of pixels per unit area is increased and a high luminance is demanded. However, in a light emitting structure of the OLED, there is a limitation in luminance (Cd) per unit area (A). Further, an increase in applied current causes a decrease in the reliability of the OLED and an increase in power consumption.

Accordingly, it is necessary to overcome the limitations in luminous efficiency, improved lifetime, and reduction in power consumption of an organic light emitting device. Such limitations hinder quality and productivity of the OLED, and various studies for developing an organic light emitting device that is capable of improving luminous efficiency, lifetime, and a viewing angle of an emission layer while retaining a color gamut have been conducted.

SUMMARY OF THE INVENTION

In order to obtain efficiency, improved lifetime, and reduction in power consumption of an organic light emitting device to improve quality and productivity of an organic light emitting display device, various organic light emitting device structures have been suggested.

Accordingly, not only an organic light emitting device structure adopting a single stack (1-stack), i.e., a single electroluminescence unit (EL unit), but also a tandem organic light emitting device structure adopting multiple stacks, i.e., a stack of multiple EL units, have been suggested.

However, luminous efficiency is not increased by simply stacking multiple EL units, and, thus, when the multiple EL units emit lights, it is necessary to obtain an effect of multiple light emitting devices connected in series.

In order to obtain luminous efficiency improved by connecting multiple light emitting devices as such, a charge generation layer (CGL) needs to be disposed between the multiple stacked EL units.

However, if the charge generation layer (CGL) is applied to the organic light emitting device of tandem structure, i.e., a stack of multiple EL units, a light leakage from an undesired adjacent sub-pixel occurs, which decreases optical reliability of an organic light emitting display device.

That is, when there is a light leakage, as an electric field is applied to a red sub-pixel, apart of an adjacent green sub-pixel may emit an undesired light, or as an electric field is applied to a blue sub-pixel, a part of an adjacent green sub-pixel may emit an undesired light.

Accordingly, the inventors of the present invention invented a new organic light emitting device structure for preventing a light leakage in an organic light emitting device by adopting multiple stacks, i.e., a stack of multiple EL units.

An object of the present invention is to provide an organic light emitting device capable of improving optical reliability by improving a light leakage phenomenon that occurs from an adjacent sub-pixel in an organic light emitting display device.

The objects of the present invention are not limited to the aforementioned objects, and other objects, which are not mentioned above, will be apparent to a person having ordinary skill in the art from the following description.

According to an organic light emitting device in an exemplary embodiment of the present invention, there is provided an organic light emitting device capable of improving optical reliability by preventing a light leakage from an adjacent sub-pixel.

According to an aspect of the present invention to achieve the above-described objects, there is provided an organic light emitting device including: a charge generation layer in the red, green, and blue sub-pixel areas between a first electrode and a second electrode, a first electroluminescence unit which includes an organic emission layer formed in red, green, and blue sub-pixel areas and formed between the first electrode and the charge generation layer, and a second electroluminescence unit which includes an organic emission layer formed in red, green, and blue sub-pixel areas and formed between the charge generation layer and the second electrode, wherein the charge generation layer is disposed not connected in each of the red, green, and blue sub-pixel areas such that the charge generation layer does not function as a lateral current path between the red, green, and blue sub-pixels.

The organic emission layer in the first electroluminescence unit and the second electroluminescence unit may include a red emission layer corresponding to the red sub-pixel area, a green emission layer corresponding to the green sub-pixel area, and a blue emission layer corresponding to the blue sub-pixel area.

The thickness of the red emission layer, the thickness of the green emission layer, and the thickness of the blue emission layer may be different from each other.

The thickness of the green emission layer in the first electroluminescence unit may be smaller than the thickness of the red emission layer in the first electroluminescence unit and greater than the thickness of the blue emission layer in the first electroluminescence unit.

The thickness of the red emission layer in the first electroluminescence unit may be greater than the thickness of the red emission layer in the second electroluminescence unit.

The thickness of the blue emission layer in the first electroluminescence unit may be smaller than the thickness of the blue emission layer in the second electroluminescence unit.

The thickness difference of the green emission layer in the first electroluminescence unit and the red emission layer in the first electroluminescence unit and the thickness difference of the green emission layer in the first electroluminescence unit and the blue emission layer in the first electroluminescence unit may be equal to or larger than 200 Å.

The thickness of the green emission layer in the first electroluminescence unit may be greater than the red emission layer in the first electroluminescence unit and smaller than the thickness of the blue emission layer in the first electroluminescence unit.

The thickness of the red emission layer in the first electroluminescence unit may be smaller than the thickness of the red emission layer in the second electroluminescence unit.

The thickness of the blue emission layer in the first electroluminescence unit may be greater than the thickness of the blue emission layer in the second electroluminescence unit.

The organic light emitting device may further comprise a first hole transporting layer under the organic emission layer of the first electroluminescence unit, and a second hole transporting layer under the organic emission layer of the second electroluminescence unit, wherein the thickness of the first hole transporting layer in the red sub-pixel area, the first hole transporting layer in the green sub-pixel area, and the first hole transporting layer in the blue sub-pixel area are different from each other.

The thickness of the first hole transporting layer in the green sub-pixel area may be smaller than the thickness of the first hole transporting layer in the red sub-pixel area and greater than the thickness of the first hole transporting layer in the blue sub-pixel area.

The thickness of the second hole transporting layer in the green sub-pixel area may be greater than the thickness of the second hole transporting layer in the red sub-pixel area and smaller than the thickness of the second hole transporting layer in the blue sub-pixel area.

The thickness difference of the first hole transporting layer in the red sub-pixel area and the first hole transporting layer in the green sub-pixel area, and the thickness difference of the first hole transporting layer in the green sub-pixel area and the first hole transporting layer in the blue sub-pixel area may be equal to or larger than 200 Å.

According to another aspect of the present invention to achieve the above-described objects, there is provided an organic light emitting device comprising a plurality of electroluminescence units between a first electrode and a second electrode, each of the plurality of electroluminescence units including an organic emission layer being disposed in a plurality of sub-pixel areas, and a charge generation layer interposed between two adjacent electroluminescence units of the plurality of electroluminescence units, the charge generation layer being disposed in the plurality of sub-pixel areas, wherein the charge generation layer has a step in each boundary between the plurality of sub-pixel areas.

The organic emission layer in each of the electroluminescence units may include a red emission layer, a green emission layer, and a blue emission layer.

The thickness of the red emission layer, the thickness of the green emission layer, and the thickness of the blue emission layer may be different from each other.

The thickness of the red emission layer is greater than the thickness of the green emission layer, and the thickness of the green emission layer may be greater than the thickness of the blue emission layer.

The height of the step of the charge generation layer may be equal to or larger than 200 Å.

According to yet another aspect of the present invention to achieve the above-described objects, there is provided an organic light emitting device including: a plurality of sub-pixel areas, each sub-pixel area comprising at least a first organic emission layer and a second organic emission layer, and a charge generation layer between the first and second organic emission layers in each sub-pixel area, the charge generation layer having a configuration that minimizes current flow between one or more charge generation layers in an adjacent sub-pixel area, wherein the configuration is achieved by thickness differences of layers under each charge generation layer in each sub-pixel area such that adjacent charge generation layers are non-continuous.

The layers under each charge generation layer in each sub-pixel area may include at least one of a hole transporting layer, an electron transporting layer and at least one of the first organic emission layer and the second organic emission layer.

The thickness differences of layers under each charge generation layer in each sub-pixel area may be equal to or larger than 200 Å.

In the organic light emitting device adopting a stack of multiple electroluminescence units according to an exemplary embodiment of the present invention, the charge generation layer (CGL) having a step is disposed in each of the red, green, and blue sub-pixel areas. Thus, an effect of a lateral current between adjacent sub-pixels can be minimized.

Accordingly, light emission from an undesired adjacent sub-pixel does not occur and a light leakage phenomenon in an organic light emitting display device can be improved.

Further, since a light leakage phenomenon that occurs in an undesired adjacent sub-pixel can be prevented, optical reliability of an organic light emitting display device adopting a stack of multiple electroluminescence units can be improved.

The effects of the present invention are not limited to the aforementioned effects, and other effects, which are not mentioned above, will be apparent to a person having ordinary skill in the art from the following description.

The objects to be achieved by the invention, the means for achieving the objects, and effects of the invention described above do not specify essential features of the claims, and, thus, the scope of the claims is not limited to the disclosure of the invention.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
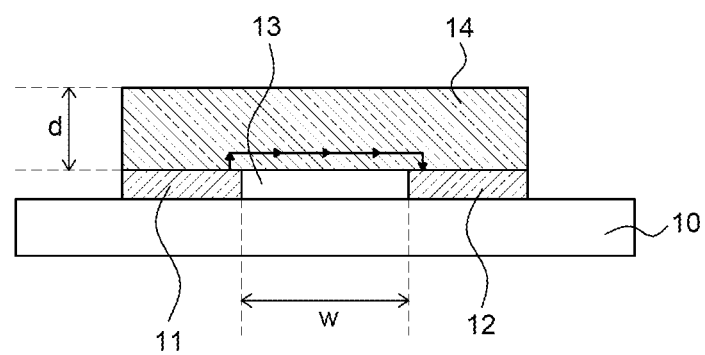
FIG. 1 is a diagram illustrating a unit element structure for evaluating a lateral current level when a charge generation layer is applied.

Advantages and features of the present invention, and methods for accomplishing the same will be more clearly understood from exemplary embodiments described below with reference to the accompanying drawings. However, the present invention is not limited to the following exemplary embodiments but may be implemented in various different forms. The exemplary embodiments are provided only to complete disclosure of the present invention and to fully provide a person having ordinary skill in the art to which the present invention pertains with the category of the invention, and the present invention will be defined by the appended claims.

The shapes, sizes, ratios, angles, numbers, and the like illustrated in the accompanying drawings for describing the exemplary embodiments of the present invention are merely examples, and the present invention is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated. When the position relation between two parts is described using the terms such as "on", "above", "below", and "next", one or more parts may be positioned between the two parts unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present invention.

The features of various embodiments of the present invention can be partially or entirely bonded to or combined with each other and can be interlocked and operated in technically various ways as can be fully understood by a person having ordinary skill in the art, and the embodiments can be carried out independently of or in association with each other.

Hereinafter, the present invention will be described in detail with reference to the accompanying drawings.

FIG. 1 is a diagram illustrating a unit element structure for evaluating a lateral current level when a charge generation layer is applied.

Referring to FIG. 1, a unit element structure for evaluating a lateral current level when a charge generation layer is applied will be described.

A bank 13 having a predetermined width W is on an upper part of a substrate 10 made of glass. A first electrode 11 and a second electrode 12 are formed to have the same thickness as the bank 13 so as to be adjacent to both side surfaces of the bank 13.

A charge generation layer (CGL) is formed of unit elements having different thicknesses d of 100 Å, 200 Å, and 1000 Å as an organic layer 14 on the bank 13, the first electrode 11, and the second electrode 12.

In the charge generation layer (CGL), a p-type charge generation layer (p-CGL) formed of a single layer of HATCN (1,4,5,8,9,11-hexaazatriphenylene-hexanitrile) is stacked on an n-type charge generation layer (n-CGL) formed of Alq3(tris(8-hydroxyquinolino)aluminum) doped with lithium (Li). The n-type charge generation layer and the p-type charge generation layer are formed to have a thickness ratio of 1:1.

Further, in order to compare a lateral current level of the unit elements constituting the charge generation layer (CGL), a unit element is formed of NPB(N,N'-Di (naphthalene-1-yl)-N,N'-diphenyl-benzidine), which is an organic material typically applied to an organic light emitting device instead of a charge generation layer (CGL). A unit element formed of NPB has a thickness of 1000 Å as an organic layer 14 having the same structure as that of the unit element constituting the charge generation layer (CGL).

Then, a DC bias voltage (V) is applied to each of the unit elements, and depending on the applied voltage, current densities (mA/cm) of the unit elements are measured and compared.

Figure 2:
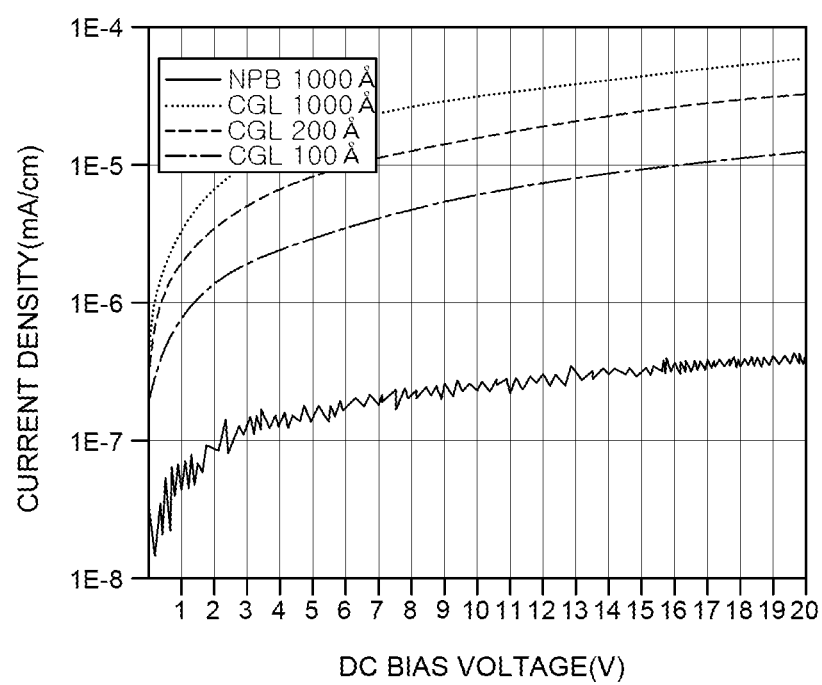
FIG. 2 is a diagram illustrating a result of a lateral current level test when the charge generation layer is applied according to the element structure of FIG. 1.

FIG. 2 is a diagram illustrating a result of a lateral current level test when the charge generation layer is applied according to the element structure of FIG. 1.

FIG. 2 illustrates a comparison in current density between the NPB formed of unit element to have the thickness of 1000 Å as the organic layer 14 and the charge generation layer (CGL) formed of the unit elements to have the thicknesses of 100 Å, 200 Å, and 1000 Å as the organic layer 14, in the unit element structure illustrated in FIG. 1.

That is, a current density level of a current flowing from the first electrode 11 toward the second electrode 12 through the organic layer 14 when a DC bias voltage is applied in each unit element is compared.

By measuring current density levels of the organic material and the charge generation layer (CGL), it is possible to check a level of a lateral current which may occur when the charge generation layer (CGL) is applied.

As can be seen from FIG. 2, when the NPB formed of the unit element to have the thickness of 1000 Å as the organic layer 14 and the charge generation layer (CGL) formed of the unit elements to have the thicknesses of 100 Å, 200 Å, and 1000 Å as the organic layer 14 are compared in terms of a current density level, all of the unit elements of the charge generation layer (CGL) having the thicknesses of 100 Å, 200 Å, and 1000 Å are higher in a current density level than the unit element of the NPB having the thickness of 1000 Å. Therefore, it is confirmed that the charge generation layer (CGL) has a higher conductivity than the organic layer typically applied to an organic light emitting device.

Further, the unit elements constituting the charge generation layer (CGL) with thicknesses of 200 Å and 100 Å is respectively smaller by ⅕ and ⅒ of the thickness of 1000 Å of the NPB that has a higher current density than the unit element constituting the NPB with the thickness of 1000 Å as the organic layer 14. Therefore, it can be seen that the charge generation layer (CGL) has a very high conductivity even with a small thickness as compared with a typical organic material.

That is, as described with reference to FIG. 2, the charge generation layer (CGL) has a higher conductivity than other organic materials applied to an organic light emitting device. Thus, if the charge generation layer (CGL) is formed on the same layer to be connected, a lateral current flowing from the first electrode 11 toward the second electrode 12 through the organic layer 14, i.e., the charge generation layer (CGL) may occur as illustrated in FIG. 1.

Therefore, in the organic light emitting device adopting multiple stacks, i.e., a stack of multiple electroluminescence units, if the charge generation layer (CGL) is commonly formed as being connected on the same layer in the red, green, blue sub-pixel areas, a lateral current flows from the charge generation layer (CGL) to an adjacent sub-pixel area. Thus, it can be seen that light is emitted from the undesired adjacent sub-pixel area, resulting in a light leakage phenomenon.

Further, as illustrated in FIG. 2, it can be confirmed that a unit element of the charge generation layer (CGL) with a greater thickness exhibits a higher lateral current level. It can be seen that the charge generation layer (CGL) is preferred to have a thickness as small as possible in order to minimize an effect of a lateral current.

Generally, a charge generation layer (CGL) can be formed to have thickness greater than 100 Å but less than 300 Å with which the charge generation layer (CGL) can serve as a charge generation layer in an organic light emitting device structure. In exemplary embodiments of the present invention, a charge generation layer is formed to have a thickness of 200 Å.

Hereinafter, organic light emitting devices according to comparative example and exemplary embodiments of the present invention will be described.

Figure 3:
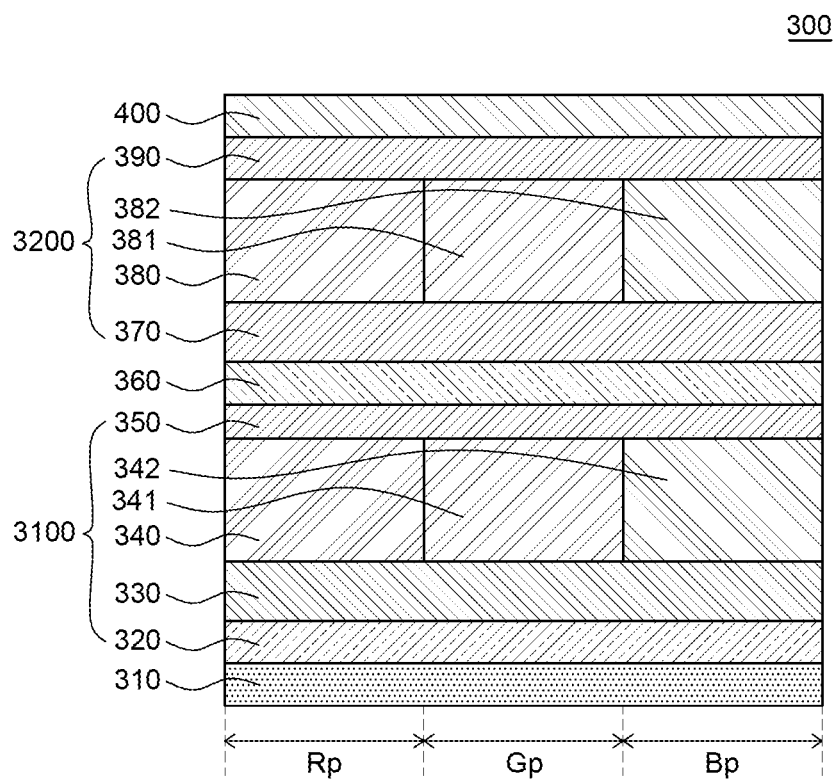
FIG. 3 is a schematic cross-sectional view of an organic light emitting device according to comparative example of the present invention.

FIG. 3 is a schematic cross-sectional view of an organic light emitting device 300 according to comparative example of the present invention.

Referring to FIG. 3, a red sub-pixel area Rp, a green sub-pixel area Gp, and a blue sub-pixel area Bp are defined on a substrate. The organic light emitting device 300 includes: an organic emission layer including a first electrode (anode) 310, a hole injection layer (HIL) 320, a first hole transporting layer (first HTL) 330, a first red emission layer (first red EML) 340, a first green emission layer (first green EML) 341, and a first blue emission layer (first blue EML) 342; an organic emission layer including a first electron transporting layer (first ETL) 350, a charge generation layer (CGL) 360, a second hole transporting layer (second HTL) 370, a second red emission layer (second red EML) 380, a second green emission layer (second green EML) 381, and a second blue emission layer (second blue EML) 382; a second electron transporting layer (second ETL) 390; and a second electrode (cathode) 400.

The organic emission layer including the HIL 320, the first HTL 330, the first red EML 340, the first green EML 341, the first blue EML 342 and the first ETL 350 constitute a first electroluminescence unit (first EL unit) 3100.

Further, the organic emission layer including the second HTL 370, the second red EML 380, the second green EML 381, the second blue EML 382 and the second ETL 390 constitute a second electroluminescence unit (second EL unit) 3200.

Furthermore, in an organic light emitting display device including an organic light emitting device according to an exemplary embodiment of the present invention, gate lines and data lines configured to define respective sub-pixel areas cross each other on a substrate. A power supply line is extended in parallel with any one of them, and a switching thin film transistor connected with the gate line and the data line and a driving thin film transistor connected with the switching thin film transistor are disposed in each sub-pixel area. The driving thin film transistor is connected with the first electrode 310. The first electrode 310 is illustrated as being formed in all of the three sub-pixel areas, but may be formed so as to be separated in the three sub-pixel areas Rp, Gp, and Bp.

The first electrode 310 may also be formed as a reflective electrode. For example, the first electrode 310 may include a layer of a transparent conductive material having a high work function, such as indium-tin-oxide (ITO) and a layer of a reflective material such as silver (Ag) or an Ag alloy.

The HIL 320 and the first HTL 330 are disposed on the first electrode 310 so as to correspond to all of the red, green, and blue sub-pixel areas Rp, Gp, and Bp.

The HIL 320 facilitates the injection of holes and may be formed of HATCH (1,4,5,8,9,11-hexaazatriphenylene-hexanitrile) and any one or more selected from the group consisting of CuPc (cupper phthalocyanine), PEDOT (poly (3,4)-ethylenedioxythiophene), PANI (polyaniline), and NPD (N,N-dinaphthyl-N,N'-diphenylbenzidine), but is not limited thereto.

Each of the first HTL 330 and the second HTL 370 is formed so as to correspond to the red sub-pixel area Rp, the green sub-pixel area Gp, and the blue sub-pixel area Bp.

The first and second HTLs 330 and 370 facilitate the transport of holes and may be formed of any one or more selected from the group consisting of NPD (N,N-dinaphthyl-N,N'-diphenylbenzidine), TPD (N,N'-bis-(3-methylphenyl)-N,N'-bis-(phenyl)-benzidine), s-TAD, and MT DATA (4,4', 4''-Tris(N-3-methylphenyl-N-phenyl-amino)-triphenylamine), but are not limited thereto.

The first and second red EMLs 340 and 380, the first and second green EMLs 341 and 381, and the first and second blue EMLs 342 and 382 are disposed in the red, green, and blue sub-pixel areas Rp, Gp, and Bp, respectively.

The red EMLs 340 and 380, the green EMLs 341 and 381, and the blue EMLs 342 and 382 include luminous materials emitting a red light, a green light, and a blue light, respectively. The luminous materials may be formed using a phosphorescent material or a fluorescent material.

To be more specific, the first and second red EMLs 340 and 380 may be formed of a phosphorescent material including a host material of CBP (carbazole biphenyl) or mCP (1,3-bis(carbazol-9-yl) and a dopant of any one or more selected from the group consisting of PIQIr(acac)(bis (1-phenylisoquinoline) acetylacetonate iridium), PQIr(acac) (bis(1-phenylquinoline) acetylacetonate iridium), PQIr(tris (1-phenylquinoline) iridium), and PtOEP (octaethylporphyrin platinum), or may be formed of a fluorescent material including PBD:Eu(DBM)3(Phen) or perylene, but are not limited thereto.

Further, the first and second green EMLs 341 and 381 may be formed of a phosphorescent material including a host material of CBP or mCP and a dopant such as an Ir complex including Ir(ppy)3(fac tris(2-phenylpyridine) iridium), or may be formed of a fluorescent material including Alq3(tris(8-hydroxyquinolino)aluminum), but are not limited thereto.

Furthermore, the first and second blue EMLs 342 and 382 may be formed of a phosphorescent material including a host material of CBP or mCP and a dopant of (4,6-F2ppy) 2Irpic. Otherwise, the first and second blue EMLs 342 and 382 may be formed of a fluorescent material including any one selected from the group consisting of spiro-DPVBi, spiro-6P, distilled benzene (DSB), distilled arylene (DSA), a PFO-based polymer, and a PPV-based polymer, but are not limited thereto.

The first ETL 350 is disposed on the first red EML 340, the first green EML 341, and the first blue EML 342. The second ETL 390 is disposed on the second red EML 380, the second green EML 381, and the second blue EML 382.

The thicknesses of the first and second ETLs 350 and 390 may be adjusted by considering electron transporting properties. The first and second ETLs 350 and 390 can transport and inject electrons, and a separate electron injection layer (EIL) may be formed on the first and second ETLs 350 and 390.

The first and second ETLs 350 and 390 facilitate the transport of electrons, and may be formed of any one or more selected from the group consisting of Alq3 (tris(8-hydroxyquinolino)aluminum), PBD (2-(4-biphenylyl)-5-(4-tert-butylpheny)-1,3,4oxadiazole), TAZ, spiro-PBD, Balq, and Salq, but are not limited thereto.

The CGL 360 is formed between the first EL unit 3100 and the second EL unit 3200 and regulates a balance of charges between the EL units.

The CGL 360 may be formed as being divided into an n-type charge generation layer (n-CGL) that assists injection of electrons into the first EL unit 3100 and a p-type charge generation layer (p-CGL) that assists injection of holes into the second EL unit 3200.

To be more specific, the n-CGL configured to inject electrons can be formed of an alkali metal, an alkali metal compound, or an organic material configured to inject electrons, or a complex thereof. For example, the n-CGL may be formed of a mixed layer of an n-type material such as lithium (Li) and an anthracene derivative doped with cesium (Cs), but is not limited thereto.

Further, the p-CGL configured to inject holes can be formed of an organic material used as a material of the first and second HILs 330 and 370. For example, the p-CGL may be formed of a single layer of a p-type material such as HATCN and F4-TCNQ, but is not limited thereto.

The EIL may be formed using Alq3 (tris(8-hydroxyquinolino)aluminum), PBD(2-(4-biphenylyl)-5-(4-tert-butylpheny)-1,3,4oxadiazole), TAZ, Spiro-PBD, Balq, or Salq, but is not limited thereto. Further, the EIL may be omitted.

Herein, the structure is not limited to the exemplary embodiments of the present invention, and at least any one of the HIL 320, the first and second HTLs 330 and 370, the first and second ETLs 350 and 390, and the EIL may be omitted. Further, the HIL 320, the first and second HTLs 330 and 370, the first and second ETLs 350 and 390, and the EIL may be formed into two or more layers.

The second electrode 400 is disposed on the second ETL 390. For example, the second electrode 400 may be formed of an alloy of magnesium and silver (Mg:Ag) to have thickness of several tens to several hundreds of Angstroms (Å) and may have a semi-transmissive property. That is, a light emitted from the organic emission layer is displayed to the outside through the second electrode 400, but since the second electrode 400 has a semi-transmissive property, a part of the light is returned to the first electrode 310.

As such, repetitive reflection occurs between the first electrode 310 serving as a reflective layer and the second electrode 400, which is referred to as a "micro cavity effect". That is, a light is repetitively reflected within a cavity between the first electrode 310 and the second electrode 400, resulting in an increase in luminous efficiency.

Alternatively, the first electrode 310 may be formed as a transmissive electrode and the second electrode 400 may be formed as a reflective electrode, and, thus, light from the organic emission layer may be displayed to the outside through the first electrode 310.

Further, although not illustrated in the drawings of the present invention, a capping layer (CPL) configured to increase light extraction efficiency of the organic light emitting device can be formed on the second electrode 400. The CPL may be formed of any one of a material of the first and second HTLs 330 and 370, a material of the first and second ETLs 350 and 390, a host material of the first and second red EMLs 340 and 380, the first and second green EMLs 341 and 381, and the first and second blue EMLs 342 and 382. Further, the CPL may be omitted.

Referring to FIG. 3, the structure of the organic light emitting device 300 according to comparative example of the present invention will be described in more detail.

As the first electrode 310, ITO (indium-tin-oxide) was formed to have a thickness of 70 Å, and an Ag alloy was formed thereon to have a thickness of 1000 Å. Then, ITO was formed thereon to have a thickness of 70 Å.

Referring to FIG. 3, HATCN was formed as the HIL 320 to have a thickness of 70 Å on the first electrode 310, and NPD was formed thereon as the first HTL 330 to have a thickness of 500 Å.

In the red sub-pixel area Rp on the first HTL 330, a beryllium (Be) complex derivative as a host material of the first red EML 340 was formed to have a thickness of 300 Å. Then it was doped with 5% of a dopant, so that the first red EML 340 was formed.

Further, in the green sub-pixel area Gp on the first HTL 330, CBP as a host material of the first green EML 341 was formed to have a thickness of 300 Å. Then it was doped with 5% of a dopant, so that the first green EML 341 was formed.

Furthermore, in the blue sub-pixel area Bp on the first HTL 330, an anthracene derivative as a host material of the first blue EML 342 was formed to have a thickness of 300 Å. Then it was doped with 5% of a dopant, so that the first blue EML 342 was formed.

On the first red EML 340, the first green EML 341, and the first blue EML 342, a mixture of an anthracene derivative and Liq (lithium quinolate) at a ratio of 1:1 was formed as the first ETL 350 to have a thickness of 70 Å.

On the first ETL 350, the CGL 360 was formed by stacking the n-CGL and the p-CGL in sequence. Alq3 was formed as the n-CGL to have a thickness of 100 Å and was doped with Li. HATCN was formed thereon as the p-CGL to have a thickness of 100 Å, so that the CGL 360 having a thickness of 200 Å was formed.

On the CGL 360, NPD was formed as the second HTL 370 to have a thickness of 600 Å.

In the red sub-pixel area Rp on the second HTL 370, a beryllium (Be) complex derivative as a host material of the second red EML 380 was formed to have a thickness of 300 Å. Then it was doped with 5% of a dopant, so that the second red EML 380 was formed.

Further, in the green sub-pixel area Gp on the second HTL 370, CBP as a host material of the second green EML 381 was formed to have a thickness of 300 Å. Then it was doped with 5% of a dopant, so that the second green EML 381 was formed.

Furthermore, in the blue sub-pixel area Bp on the second HTL 370, an anthracene derivative as a host material of the second blue EML 382 was formed to have a thickness of 300 Å. Then it was doped with 5% of a dopant, so that the second blue EML 382 was formed.

On the second red EML 380, the second green EML 381, and the second blue EML 382, a mixture of an anthracene derivative and Liq (lithium quinolate) at a ratio of 1:1 was formed as the second ETL 390 to have a thickness of 300 Å.

On the second ETL 390, a magnesium-silver alloy (Mg:Ag) mixed at a ratio of 9:1 was formed as the second electrode 400, which is a semi-transmissive electrode, to have a thickness of 140 Å.

According to comparative example illustrated in FIG. 3, a step between the sub-pixels of the organic light emitting device 300 will be described by focusing on the first electrode 310. A step is not formed between the first red EML 340 and the first green EML 341, between the first green EML 341 and the first blue EML 342, or between the first blue EML 342 and the first red EML 340.

Therefore, the CGL 360 in the red sub-pixel area Rp, the CGL 360 in the green sub-pixel area Gp, and the CGL 360 in the blue sub-pixel area Bp are formed as being connected with each other.

That is, in the organic light emitting device 300 according to comparative example of the present invention, the CGL 360 does not have a step and is formed as being connected between adjacent sub-pixels. Thus, a lateral current flows from the highly conductive CGL 360 to an adjacent sub-pixel and a light leakage phenomenon occurs.

Therefore, if the CGL 360 has a step and is formed so as to be separated in adjacent sub-pixel areas, it is possible to prevent the generation of a lateral current caused by a high conductivity of the CGL 360. Accordingly, it is possible to prevent a light leakage phenomenon.

Figure 4:
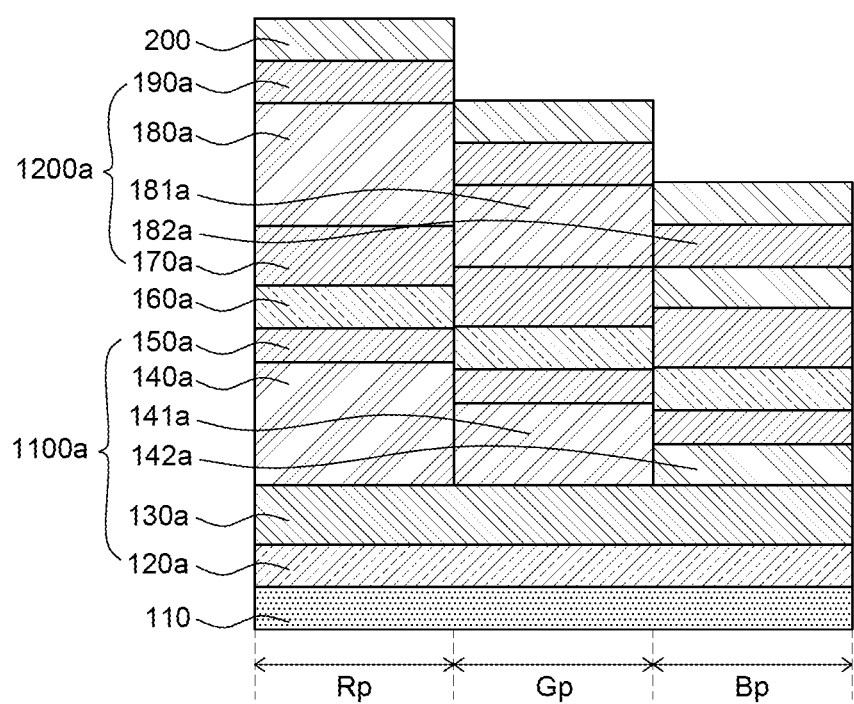
FIG. 4 is a schematic cross-sectional view of an organic light emitting device according to an exemplary embodiment of the present invention.

FIG. 4 is a schematic cross-sectional view of an organic light emitting device 100A according to an exemplary embodiment of the present invention.

In the present exemplary embodiment, descriptions on components identical or corresponding to those in comparative example will be omitted.

Hereinafter, referring to FIG. 4, the structure of the organic light emitting device 100A according to an exemplary embodiment of the present invention will be described in more detail.

Referring to FIG. 4, as a first electrode 110, ITO (indium-tin-oxide) was formed to have a thickness of 70 Å. An Ag alloy was formed thereon to have a thickness of 1000 Å, and then, ITO was formed thereon to have a thickness of 70 Å.

HATCN was formed as an HIL 120a to have a thickness of 70 Å on the first electrode 110. Then, NPD was formed thereon as a first HTL 130a to have a thickness of 500 Å.

In the red sub-pixel area Rp on the first HTL 130a, a beryllium (Be) complex derivative as a host material of a first red EML 140a was formed to have a thickness of 650 Å. Then it was doped with 5% of a dopant, so that the first red EML 140a was formed.

Further, in the green sub-pixel area Gp on the first HTL 130a, CBP as a host material of a first green EML 141a was formed to have a thickness of 400 Å. Then it was doped with 5% of a dopant, so that the first green EML 141a was formed.

Furthermore, in the blue sub-pixel area Bp on the first HTL 130a, an anthracene derivative as a host material of a first blue EML 142a was formed to have a thickness of 200 Å. Then it was doped with 5% of a dopant, so that the first blue EML 142a was formed.

On the first red EML 140a, the first green EML 141a, and the first blue EML 142a, a mixture of an anthracene derivative and Liq (lithium quinolate) at a ratio of 1:1 was formed as a first ETL 150a to have a thickness of 70 Å.

On the first ETL 150a, a CGL 160a was formed by stacking an n-CGL and a p-CGL in sequence. Alq3 was formed as the n-CGL to have a thickness of 100 Å and was doped with Li. Then, HATCN was formed thereon as the p-CGL to have a thickness of 100 Å, so that the CGL 160a having a thickness of 200 Å was formed.

On the CGL 160a, NPD was formed as a second HTL 170a to have a thickness of 400 Å.

In the red sub-pixel area Rp on the second HTL 170a, a beryllium (Be) complex derivative as a host material of a second red EML 180a was formed to have a thickness of 650 Å. Then it was doped with 5% of a dopant, so that the second red EML 180a was formed.

Further, in the green sub-pixel area Gp on the second HTL 170a, CBP as a host material of a second green EML 181a was formed to have a thickness of 400 Å. Then it was doped with 5% of a dopant, so that the second green EML 181a was formed.

Furthermore, in the blue sub-pixel area Bp on the second HTL 170a, an anthracene derivative as a host material of a second blue EML 182a was formed to have a thickness of 200 Å. Then it was doped with 5% of a dopant, so that the second blue EML 182a was formed.

On the second red EML 180a, the second green EML 181a, and the second blue EML 182a, a mixture of an anthracene derivative and Liq (lithium quinolate) at a ratio of 1:1 was formed as a second ETL 190a to have a thickness of 300 Å.

On the second ETL 190a, a magnesium-silver alloy (Mg:Ag) mixed at a ratio of 9:1 was formed as a second electrode 200, which is a semi-transmissive electrode, to have a thickness of 140 Å.

Referring to FIG. 4, a step between the sub-pixels of the organic light emitting device 100A will be described by focusing on the first electrode 110. A step height of 250 Å was formed between the first red EML 140a and the first green EML 141a. A step height of 200 Å was formed between the first green EML 141a and the first blue EML 142a, and a step height of 450 Å was formed between the first blue EML 142a and the first red EML 140a.

As such, in the organic light emitting device 100A according to the present exemplary embodiment, all of the steps between the first red EML 140a and the first green EML 141a, between the first green EML 141a and the first blue EML 142a, and between the first blue EML 142a and the first red EML 140a are larger than 200 Å. Therefore, the CGLs 160a respectively formed in the red, green, and blue sub-pixel areas on the organic emission layer have step heights of larger than 200 Å.

Therefore, the CGL 160a in the red sub-pixel area Rp, the CGL 160a in the green sub-pixel area Gp, and the CGL 160a in the blue sub-pixel area Bp are substantially not connected with each other or non-continuous. When the CGLs 160a are substantially not connected in two sub-pixel areas, the CGLs 160a formed in the respective sub-pixel areas may be separated. Or even if they are not separated, the CGL 160a does not function as a lateral current path between the red, green, and blue sub-pixels, such that the above-described lateral current hardly flows. In the same context, the CGLs 160a may be substantially separated due to the steps in each boundary between the red, green, and blue sub-pixel areas.

As a result, in the organic light emitting device 100A according to an exemplary embodiment of the present invention, a lateral current caused by a high conductivity of the CGLs 160a is not generated. Thus, it is possible to prevent a light leakage phenomenon. As described above, the minimization of current flow between one or more CGLs 160a in an adjacent sub-pixel areas can be achieved by thickness differences of layers under each of CGLs in respective sub-pixel area such that the adjacent CGLs 160a are non-continuous. The layers under each charge generation layer in each sub-pixel area include at least one of HTL 130a 170a, ETL 150a 190a and at least one of the first EMLs and the second EMLs. In the meantime, the thickness differences of layers under each CGLs in each sub-pixel area may be equal to or larger than 200 Å.

Figure 5:
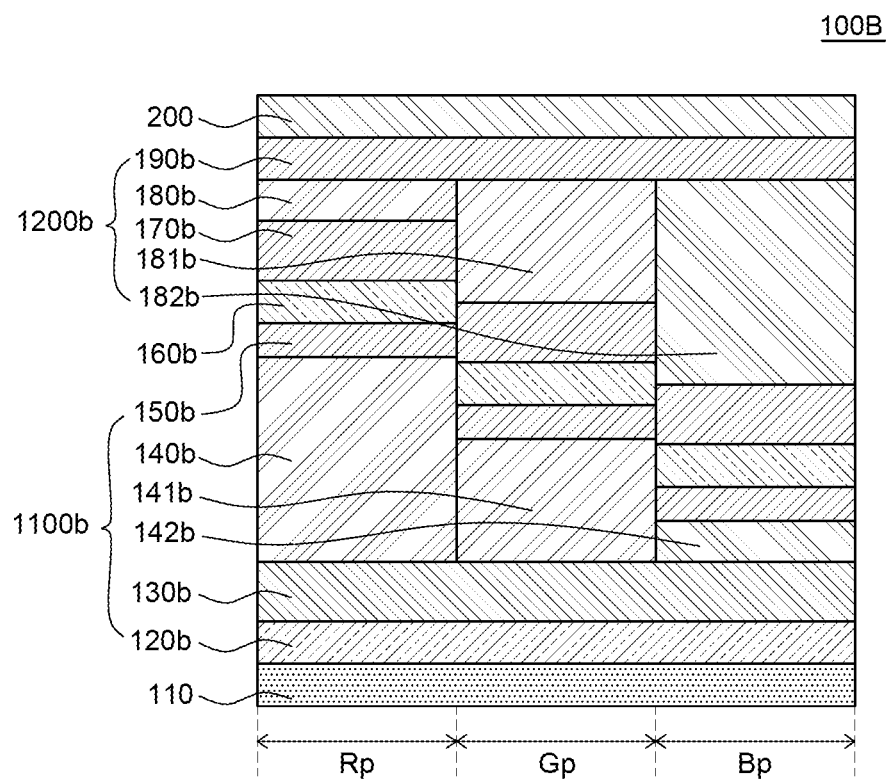
FIG. 5 is a schematic cross-sectional view of an organic light emitting device according to another exemplary embodiment of the present invention.

FIG. 5 is a schematic cross-sectional view of an organic light emitting device 100B according to another exemplary embodiment of the present invention.

In the present exemplary embodiment, descriptions on components identical or corresponding to those of comparative example will be omitted.

Hereinafter, referring to FIG. 5, the structure of the organic light emitting device 100B according to another exemplary embodiment of the present invention will be described in more detail.

Referring to FIG. 5, as the first electrode 110, ITO (indium-tin-oxide) was formed to have a thickness of 70 Å. An Ag alloy was formed thereon to have a thickness of 1000 Å, and then, ITO was formed thereon to have a thickness of 70 Å.

HATCN was formed as an HIL 120b to have a thickness of 70 Å on the first electrode 110. Then, NPD was formed thereon as a first HTL 130b to have a thickness of 500 Å.

In the red sub-pixel area Rp on the first HTL 130b, a beryllium (Be) complex derivative as a host material of a first red EML 140b was formed to have a thickness of 850 Å. Then it was doped with 5% of a dopant, so that the first red EML 140b was formed.

Further, in the green sub-pixel area Gp on the first HTL 130b, CBP as a host material of a first green EML 141b was formed to have a thickness of 400 Å. Then it was doped with 5% of a dopant, so that the first green EML 141b was formed.

Furthermore, in the blue sub-pixel area Bp on the first HTL 130b, an anthracene derivative as a host material of a first blue EML 142b was formed to have a thickness of 100 Å. Then it was doped with 5% of a dopant, so that the first blue EML 142b was formed.

On the first red EML 140b, the first green EML 141b, and the first blue EML 142b, a mixture of an anthracene derivative and Liq (lithium quinolate) at a ratio of 1:1 was formed as a first ETL 150b to have a thickness of 70 Å.

On the first ETL 150b, a CGL 160b was formed by stacking an n-CGL and a p-CGL in sequence. Alq3 was formed as the n-CGL to have a thickness of 100 Å and was doped with Li. Then, HATCN was formed thereon as the p-CGL to have a thickness of 100 Å, so that the CGL 160b having a thickness of 200 Å was formed.

On the CGL 160b, NPD was formed as a second HTL 170b to have a thickness of 500 Å.

In the red sub-pixel area Rp on the second HTL 170b, a beryllium (Be) complex derivative as a host material of a second red EML 180b was formed to have a thickness of 300 Å. Then it was doped with 5% of a dopant, so that the second red EML 180b was formed.

Further, in the green sub-pixel area Gp on the second HTL 170b, CBP as a host material of a second green EML 181b was formed to have a thickness of 400 Å. Then it was doped with 5% of a dopant, so that the second green EML 181b was formed.

Furthermore, in the blue sub-pixel area Bp on the second HTL 170b, an anthracene derivative as a host material of a second blue EML 182b was formed to have a thickness of 450 Å. Then it was doped with 5% of a dopant, so that the second blue EML 182b was formed.

On the second red EML 180b, the second green EML 181b, and the second blue EML 182b, a mixture of an anthracene derivative and Liq (lithium quinolate) at a ratio of 1:1 was formed as a second ETL 190b to have a thickness of 300 Å.

On the second ETL 190b, a magnesium-silver alloy (Mg:Ag) mixed at a ratio of 9:1 was formed to have a thickness of 140 Å as the second electrode 200 which is a semi-transmissive electrode.

Referring to FIG. 5, a step between the sub-pixels of the organic light emitting device 100B will be described by focusing on the first electrode 110. A step height of 450 Å was formed between the first red EML 140b and the first green EML 141b. A step height of 300 Å was formed between the first green EML 141b and the first blue EML 142b, and a step height of 750 Å was formed between the first blue EML 142b and the first red EML 140b.

As such, in the organic light emitting device 100B according to the present exemplary embodiment, all of the steps between the first red EML 140b and the first green EML 141b, between the first green EML 141b and the first blue EML 142b, and between the first blue EML 142b and the first red EML 140b are larger than 300 Å.

Therefore, the CGLs 160b respectively formed in the red, green, and blue sub-pixel areas on the organic emission layer have step heights of larger than 300 Å.

Therefore, the CGL 160b in the red sub-pixel area Rp, the CGL 160b in the green sub-pixel area Gp, and the CGL 160b in the blue sub-pixel area Bp are substantially not connected with each other due to the steps in each boundary between the red, green, and blue sub-pixel areas.

As a result, in the organic light emitting device 100B according to another exemplary embodiment of the present invention, a lateral current caused by a high conductivity of the CGLs 160b is not generated. Thus, it is possible to prevent a light leakage phenomenon.

Figure 6:
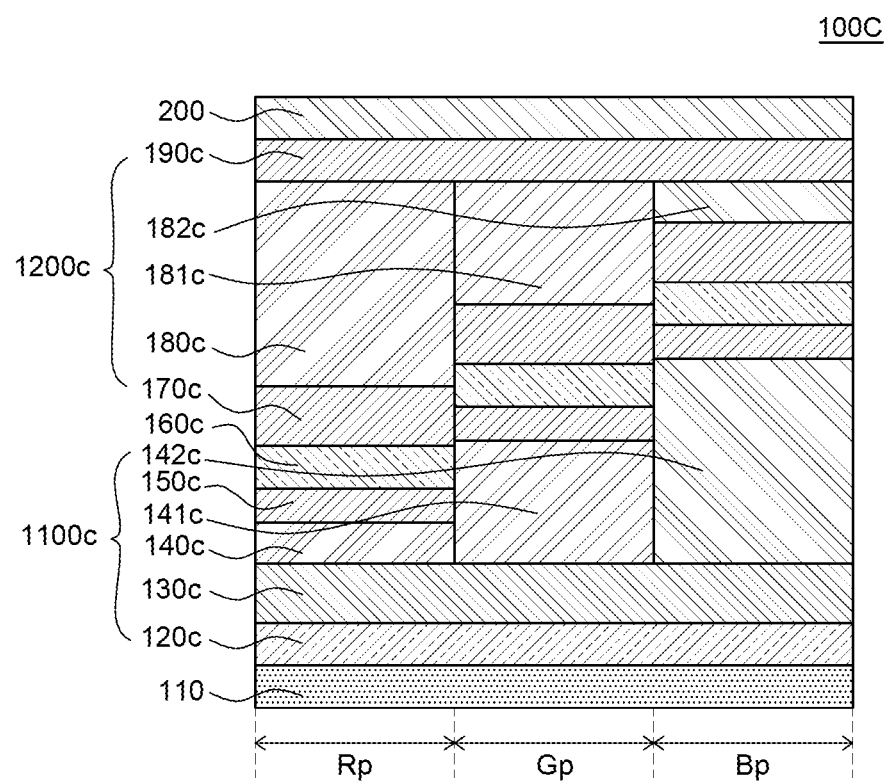
FIG. 6 is a schematic cross-sectional view of an organic light emitting device according to yet another exemplary embodiment of the present invention.

FIG. 6 is a schematic cross-sectional view of an organic light emitting device 100C according to yet another exemplary embodiment of the present invention.

In the present exemplary embodiment, descriptions on components identical or corresponding to those of comparative example will be omitted.

Hereinafter, referring to FIG. 6, the structure of the organic light emitting device 100C according to yet another exemplary embodiment of the present invention will be described in more detail.

Referring to FIG. 6, as the first electrode 110, ITO (indium-tin-oxide) was formed to have a thickness of 70 Å. An Ag alloy was formed thereon to have a thickness of 1000 Å, and then, ITO was formed thereon to have a thickness of 70 Å. HATCN was formed as an HIL 120c to have a thickness of 70 Å on the first electrode 110. Then NPD was formed thereon as a first HTL 130c to have a thickness of 500 Å.

In the red sub-pixel area Rp on the first HTL 130c, a beryllium (Be) complex derivative as a host material of a first red EML 140c was formed to have a thickness of 100 Å. Then it was doped with 5% of a dopant, so that the first red EML 140c was formed.

Further, in the green sub-pixel area Gp on the first HTL 130c, CBP as a host material of a first green EML 141c was formed to have a thickness of 400 Å. Then it was doped with 5% of a dopant, so that the first green EML 141c was formed.

Furthermore, in the blue sub-pixel area Bp on the first HTL 130c, an anthracene derivative as a host material of a first blue EML 142c was formed to have a thickness of 850 Å. Then it was doped with 5% of a dopant, so that the first blue EML 142c was formed.

On the first red EML 140c, the first green EML 141c, and the first blue EML 142c, a mixture of an anthracene derivative and Liq (lithium quinolate) at a ratio of 1:1 was formed as a first ETL 150c to have a thickness of 70 Å.

On the first ETL 150c, a CGL 160c was formed by stacking an n-CGL and a p-CGL in sequence. Alq3 was formed as the n-CGL to have a thickness of 100 Å and was doped with Li. Then, HATCN was formed thereon as the p-CGL to have a thickness of 100 Å, so that the CGL 160c having a thickness of 200 Å was formed.

On the CGL 160c, NPD was formed as a second HTL 170c to have a thickness of 500 Å.

In the red sub-pixel area Rp on the second HTL 170c, a beryllium (Be) complex derivative as a host material of a second red EML 180c was formed to have a thickness of 450 Å. Then it was doped with 5% of a dopant, so that the second red EML 180c was formed.

Further, in the green sub-pixel area Gp on the second HTL 170c, CBP as a host material of a second green EML 181c was formed to have a thickness of 400 Å. Then it was doped with 5% of a dopant, so that the second green EML 181c was formed.

Furthermore, in the blue sub-pixel area Bp on the second HTL 170c, an anthracene derivative as a host material of a second blue EML 182c was formed to have a thickness of 300 Å. Then it was doped with 5% of a dopant, so that the second blue EML 182c was formed.

On the second red EML 180c, the second green EML 181c, and the second blue EML 182c, a mixture of an anthracene derivative and Liq (lithium quinolate) at a ratio of 1:1 was formed as a second ETL 190c to have a thickness of 300 Å.

On the second ETL 190c, a magnesium-silver alloy (Mg:Ag) mixed at a ratio of 9:1 was formed to have a thickness of 140 Å as the second electrode 200 which is a semi-transmissive electrode.

Referring to FIG. 6, a step between the sub-pixels of the organic light emitting device 100C will be described by focusing on the first electrode 110. A step height of 300 Å was formed between the first red EML 140c and the first green EML 141c. A step height of 450 Å was formed between the first green EML 141c and the first blue EML 142c, and a step height of 750 Å was formed between the first blue EML 142c and the first red EML 140c.

As such, in the organic light emitting device 100C according to the present exemplary embodiment, all of the steps between the first red EML 140c and the first green EML 141c, between the first green EML 141c and the first blue EML 142c, and between the first blue EML 142c and the first red EML 140c are larger than 300 Å.

Therefore, the CGL 160c in the red sub-pixel area Rp, the CGL 160c in the green sub-pixel area Gp, and the CGL 160c in the blue sub-pixel area Bp are substantially not connected with each other.

As a result, in the organic light emitting device 100C according to yet another exemplary embodiment of the present invention, a lateral current caused by a high conductivity of the CGLs 160c is not generated. Thus, it is possible to prevent a light leakage phenomenon.

Figure 7:
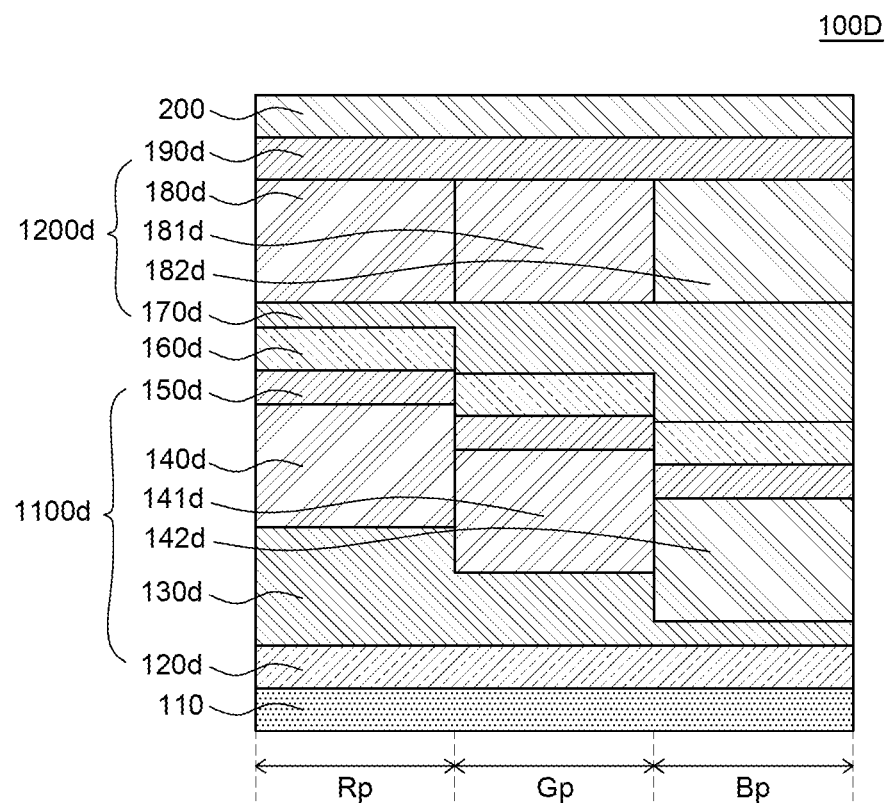
FIG. 7 is a schematic cross-sectional view of an organic light emitting device according to still another exemplary embodiment of the present invention.

FIG. 7 is a schematic cross-sectional view of an organic light emitting device 100D according to still another exemplary embodiment of the present invention.

In the present exemplary embodiment, descriptions on components identical or corresponding to those of comparative example will be omitted.

Hereinafter, referring to FIG. 7, the structure of the organic light emitting device 100D according to still another exemplary embodiment of the present invention will be described in more detail.

Referring to FIG. 7, as the first electrode 110, ITO (indium-tin-oxide) was formed to have a thickness of 70 Å, an Ag alloy was formed thereon to have a thickness of 1000 Å. Then, ITO was formed thereon to have a thickness of 70 Å.

HATCN was formed as an HIL 120d to have a thickness of 70 Å on the first electrode 110.

NPD was formed on the HIL 120d as a first HTL 130d to have a thickness of 1200 Å in the red sub-pixel area Rp, 500 Å in the green sub-pixel area Gp, and 300 Å in the blue sub-pixel area Bp.

In order for the first HTL 130d to have steps in the red sub-pixel area, the green sub-pixel area, and the blue sub-pixel area, a method of depositing the layer with different thicknesses in the respective sub-pixel areas using a mask or patterning by laser thermal printing may be applied.

In the red sub-pixel area Rp on the first HTL 130d having steps in the respective sub-pixel areas, a beryllium (Be) complex derivative as a host material of a first red EML 140d was formed to have a thickness of 300 Å. Then it was doped with 5% of a dopant, so that the first red EML 140d was formed.

Further, in the green sub-pixel area Gp on the first HTL 130d having steps in the respective sub-pixel areas, CBP as a host material of a first green EML 141d was formed to have a thickness of 300 Å. Then it was doped with 5% of a dopant, so that the first green EML 141d was formed.

Furthermore, in the blue sub-pixel area Bp on the first HTL 130d having steps in the respective sub-pixel areas, an anthracene derivative as a host material of a first blue EML 142d was formed to have a thickness of 300 Å. Then it was doped with 5% of a dopant, so that the first blue EML 142d was formed.

On the first red EML 140d, the first green EML 141d, and the first blue EML 142d, a mixture of an anthracene derivative and Liq (lithium quinolate) at a ratio of 1:1 was formed as a first ETL 150d to have a thickness of 70 Å.

On the first ETL 150d, a CGL 160d was formed by stacking an n-CGL and a p-CGL in sequence. Alq3 was formed as the n-CGL to have a thickness of 100 Å and was doped with Li. Then, HATCN was formed thereon as the p-CGL to have a thickness of 100 Å, so that the CGL 160d having a thickness of 200 Å was formed.

NPD was formed on the CGL 160d as a second HTL 170d to have a thickness of 300 Å in the red sub-pixel area Rp, 500 Å in the green sub-pixel area Gp, and 1200 Å in the blue sub-pixel area Bp.

Further, in order for the first HTL 130d to have steps in the red sub-pixel area, the green sub-pixel area, and the blue sub-pixel area, a method of depositing the layer with different thicknesses in the respective sub-pixel areas using a mask or a method of patterning by laser thermal printing may be applied.

In the red sub-pixel area Rp on the second HTL 170d, a beryllium (Be) complex derivative as a host material of a second red EML 180d was formed to have a thickness of 300 Å. Then it was doped with 5% of a dopant, so that the second red EML 180d was formed.

Further, in the green sub-pixel area Gp on the second HTL 170d, CBP as a host material of a second green EML 181d was formed to have a thickness of 300 Å. Then it was doped with 5% of a dopant, so that the second green EML 181d was formed.

Furthermore, in the blue sub-pixel area Bp on the second HTL 170d, an anthracene derivative as a host material of a second blue EML 182d was formed to have a thickness of 300 Å. Then it was doped with 5% of a dopant, so that the second blue EML 182d was formed.

On the second red EML 180d, the second green EML 181d, and the second blue EML 182d, a mixture of an anthracene derivative and Liq (lithium quinolate) at a ratio of 1:1 was formed as a second ETL 190d to have a thickness of 300 Å.

On the second ETL 190d, a magnesium-silver alloy (Mg:Ag) mixed at a ratio of 9:1 was formed to have a thickness of 140 Å as the second electrode 200 which is a semi-transmissive electrode.

Referring to FIG. 7, a step between the sub-pixels of the organic light emitting device 100D will be described by focusing on the first electrode 110. A step height of 700 Å was formed between the first red EML 140d and the first green EML 141d. A step height of 200 Å was formed between the first green EML 141d and the first blue EML 142d, and a step height of 900 Å was formed between the first blue EML 142d and the first red EML 140d.

As such, in the organic light emitting device 100D according to the present exemplary embodiment, all of the steps between the first red EML 140d and the first green EML 141d, between the first green EML 141d and the first blue EML 142d, and between the first blue EML 142d and the first red EML 140d are larger than 200 Å. Therefore, the CGLs 160d respectively formed in the red, green, and blue sub-pixel areas on the organic emission layer have step heights of larger than 200 Å.

Therefore, the CGL 160d in the red sub-pixel area Rp, the CGL 160d in the green sub-pixel area Gp, and the CGL 160d in the blue sub-pixel area Bp are substantially not connected with each other.

As a result, in the organic light emitting device 100D according to still another exemplary embodiment of the present invention, a lateral current caused by a high conductivity of the CGLs 160d is not generated. Thus, it is possible to prevent a light leakage phenomenon.

As described above, in comparative example of the present invention, if the CGL present between the first EL unit and the second EL unit is formed as being connected without a step in the red sub-pixel area, the green sub-pixel area, and the blue sub-pixel area, the CGL is commonly formed as being connected on the same layer on the first EL unit.

Therefore, as can be seen from comparative example of the present invention, a lateral current flows from the highly conductive CGL to an adjacent sub-pixel and a light leakage phenomenon occurs.

However, as described in the exemplary embodiments of the present invention, the CGLs present between the first EL unit and the second EL unit may be formed to have steps of larger than 200 Å in the respective red sub-pixel area Rp, the green sub-pixel area Gp, and the blue sub-pixel area Bp. Thus, the CGLs are substantially not connected with each other in the sub-pixel areas.

As a result, a lateral current does not flow from the CGL to an adjacent sub-pixel and it is possible to prevent a light leakage phenomenon.

The first HTL 130d and the second HTL 170d between adjacent sub-pixels may be formed to have different thicknesses as described in the exemplary embodiment of the present invention. Likewise, the first ETL 150d and the second ETL 190d as common layers in the organic light emitting devices may be formed to have different thicknesses in each of the sub-pixel areas. In such configuration, the CGLs 160d may be more easily separated due to the different thicknesses of the first and second ETL 150d 190d in sub-pixel areas. As a result, a lateral current in the CGLs 160d is reduced further and it is possible to substantially prevent a light leakage phenomenon.

If two or more of the above-described methods for forming the CGL to have a step are combined and applied, it is possible to form the CGL to have a greater step. Therefore, it is also possible to obtain a more improved effect for preventing a light leakage phenomenon caused by a lateral current from the CGL.

Furthermore, even in a bottom-emission organic light emitting display device, it is possible to prevent a light leakage phenomenon in the same manner as described in the exemplary embodiments of the present invention. For example, the bottom-emission organic light emitting device can be in which the first electrode 110 is formed as a transmissive electrode having transmissivity of 80% and the second electrode 200 as a reflective electrode. Thus, it is possible to obtain an effect of improving optical reliability of the organic light emitting display device.

Although the exemplary embodiments of the present invention have been described in detail with reference to the accompanying drawings, the present invention is not limited thereto and may be embodied in many different forms without departing from the technical concept of the present invention. Therefore, the exemplary embodiments of the present invention are provided for illustrative purposes only but not intended to limit the technical concept of the present invention. The scope of the technical concept of the present invention is not limited thereto. Therefore, it should be understood that the above-described exemplary embodiments are illustrative in all aspects and do not limit the present invention. The protective scope of the present invention should be construed based on the following claims, and all the technical concepts in the equivalent scope thereof should be construed as falling within the scope of the present invention.

What is claimed is:
1. An organic light emitting device comprising:
a charge generation layer in red, green, and blue sub-pixel areas between a first electrode and a second electrode;
a first electroluminescence unit which includes an organic emission layer fanned in the red, green, and blue sub-pixel areas and formed between the first electrode and the charge generation layer; and a second electroluminescence unit which includes an organic emission layer formed in the red, green, and blue sub-pixel areas and formed between the charge generation layer and the second electrode, wherein the charge generation layer is disposed in each of the red, green, and blue sub-pixel areas in a disconnected manner such that the charge generation layer does not function as a lateral current path between the red, green, and blue sub-pixel areas.

2. The organic light emitting device according to claim 1, wherein the organic emission layers in the first electroluminescence unit and the second electroluminescence unit include a red emission layer corresponding to the red sub-pixel area, a green emission layer corresponding to the green sub-pixel area, and a blue emission layer corresponding to the blue sub-pixel area, respectively.

3. The organic light emitting device according to claim 2, wherein a thickness of the red emission layer, a thickness of the green emission layer, and a thickness of the blue emission layer in the first electroluminescence unit are different from each other.

4. The organic light emitting device according to claim 3, wherein the thickness of the green emission layer in the first electroluminescence unit is smaller than the thickness of the red emission layer in the first electroluminescence unit and greater than the thickness of the blue emission layer in the first electroluminescence unit.

5. The organic light emitting device according to claim 4, the thickness of the red emission layer in the first electroluminescence unit is greater than the thickness of the red emission layer in the second electroluminescence unit.

6. The organic light emitting device according to claim 5, wherein the thickness of the blue emission layer in the first electroluminescence unit is smaller than the thickness of the blue emission layer in the second electroluminescence unit.

7. The organic light emitting device according to claim 4, wherein a thickness difference of the green emission layer in the first electroluminescence unit and the red emission layer in the first electroluminescence unit and a thickness difference of the green emission layer in the first electroluminescence unit and the blue emission layer in the first electroluminescence unit are equal to or larger than 200 Å.

8. The organic light emitting device according to claim 4, further comprising:
a first hole transporting layer under the organic emission layer of the first electroluminescence unit; and
a second hole transporting layer under the organic emission layer of the second electroluminescence unit,
wherein a thickness of the first hole transporting layer in the red sub-pixel area, a thickness of the first hole transporting layer in the green sub-pixel area, and a thickness of the first hole transporting layer in the blue sub-pixel area are different from each other.

9. The organic light emitting device according to claim 8, wherein the thickness of the first hole transporting layer in the green sub-pixel area is smaller than the thickness of the first hole transporting layer in the red sub-pixel area and greater than the thickness of the first hole transporting layer in the blue sub-pixel area.

10. The organic light emitting device according to claim 9, wherein a thickness of the second hole transporting layer in the green sub-pixel area is greater than a thickness of the second hole transporting layer in the red sub-pixel area and smaller than a thickness of the second hole transporting layer in the blue sub-pixel area.

11. The organic light emitting device according to claim 9, wherein a thickness difference of the first hole transporting layer in the red sub-pixel area and the first hole transporting layer in the green sub-pixel area, and a thickness difference of the first hole transporting layer in the green sub-pixel area and the first hole transporting layer in the blue sub-pixel area are equal to or larger than 200 Å.

12. The organic light emitting device according to claim 3, wherein the thickness of the green emission layer in the first electroluminescence unit is greater than the red emission layer in the first electroluminescence unit and smaller than the thickness of the blue emission layer in the first electroluminescence unit.

13. The organic light emitting device according to claim 12, wherein the thickness of the red emission layer in the first electroluminescence unit is smaller than the thickness of the red emission layer in the second electroluminescence unit.

14. The organic light emitting device according to claim 13, wherein the thickness of the blue emission layer in the first electroluminescence unit is greater than the thickness of the blue emission layer in the second electroluminescence unit.

15. An organic light emitting device comprising:
a plurality of electroluminescence units between a first electrode and a second electrode, each of the plurality of electroluminescence units including an organic emission layer being disposed in a plurality of sub-pixel areas; and
a charge generation layer interposed between two adjacent electroluminescence units of the plurality of electroluminescence units, the charge generation layer being disposed in the plurality of sub-pixel areas,
wherein the charge generation layer has a step in each boundary between adjacent sub-pixel areas, such that the charge generation layer is disconnected between the adjacent sub-pixel areas.

16. The organic light emitting device according to claim 15, wherein the organic emission layer in each of the electroluminescence units includes a red emission layer, a green emission layer, and a blue emission layer.

17. The organic light emitting device according to claim 16, wherein a thickness of the red emission layer, a thickness of the green emission layer, and a thickness of the blue emission layer are different from each other.

18. The organic light emitting device according to claim 17, wherein the thickness of the red emission layer in the electroluminescence unit is greater than the thickness of the green emission layer in the electroluminescence unit, and the thickness of the green emission layer in the electroluminescence unit is greater than the thickness of the blue emission layer in the electroluminescence unit.

19. The organic light emitting device according to claim 15, wherein a height of the step of the charge generation layer is equal to or larger than 200 Å.

20. An organic light emitting device comprising:
a plurality of sub-pixel areas, each sub-pixel area comprising at least a first organic emission layer and a second organic emission layer; and
a charge generation layer between the first and second organic emission layers in each sub-pixel area, the charge generation layer having a configuration that minimizes current flow between one or more charge generation layers in an adjacent sub-pixel area,
wherein the configuration is achieved by thickness differences of layers under each charge generation layer in each sub-pixel area such that adjacent charge generation layers are non-continuous.

21. The organic light emitting device according to claim 20, wherein the layers under each charge generation layer in each sub-pixel area include at least one among a hole transporting layer, an electron transporting layer and either the first organic emission layer or the second organic emission layer.

22. The organic light emitting device according to claim 20, wherein the thickness differences of layers under each charge generation layer in each sub-pixel area are equal to or larger than 200 Å.

* * * * *